United States Patent [19]
Nakabayashi et al.

[11] Patent Number: 6,114,095
[45] Date of Patent: Sep. 5, 2000

[54] METHOD OF MANUFACTURING ELECTRONIC DEVICE USING PHASE-SHIFTING MASK WITH MULTIPLE PHASE-SHIFT REGIONS

[75] Inventors: Takashi Nakabayashi, Osaka; Koji Matsuoka, Kanagawa, both of Japan

[73] Assignee: Matsushita Electronics Corporation, Osaka, Japan

[21] Appl. No.: 09/107,443

[22] Filed: Jun. 30, 1998

[30] Foreign Application Priority Data

Jul. 1, 1997 [JP] Japan .................................. 9-175423

[51] Int. Cl.⁷ .............................. G03F 9/00; G03C 5/00
[52] U.S. Cl. ................................ 430/311; 430/5; 430/396
[58] Field of Search ............................. 430/5, 311, 312, 430/313, 322, 323, 396

[56] References Cited

U.S. PATENT DOCUMENTS

| | | | |
|---|---|---|---|
| 5,411,823 | 5/1995 | Okamoto | 430/5 |
| 5,441,834 | 8/1995 | Takekuma et al. | 430/5 |
| 5,621,498 | 4/1997 | Inoue et al. | 355/67 |
| 5,637,424 | 6/1997 | Haruki et al. | 430/5 |
| 5,680,588 | 10/1997 | Gortych et al. | 430/311 |
| 5,725,971 | 3/1998 | Moriuchi et al. | 430/5 |
| 5,744,268 | 4/1998 | Nakao | 430/5 |
| 5,783,336 | 7/1998 | Aoki et al. | 430/5 |
| 5,786,114 | 7/1998 | Hashimoto | 430/5 |
| 5,789,116 | 8/1998 | Kim | 430/5 |
| 5,840,448 | 11/1998 | Borodovsky et al. | 430/5 |
| 5,863,712 | 1/1999 | Von Bunau et al. | 355/53 |
| 5,902,702 | 5/1999 | Nakao et al. | 430/5 |

FOREIGN PATENT DOCUMENTS

| | | |
|---|---|---|
| 5-142749 | 11/1993 | Japan . |
| 6-267822 | 9/1994 | Japan . |
| 8-279452 | 10/1996 | Japan . |
| 9-090601 | 4/1997 | Japan . |
| 9-106062 | 4/1997 | Japan . |
| 9-106063 | 4/1997 | Japan . |

OTHER PUBLICATIONS

J.Y. Lee, et al., Simultaneously Formed Storage Node Contact and Metal Contact Cell (SSMC) for 1Gb DRAM and Beyond, IEDM '96 Technical Digest, pp. 593, 1996.

*Primary Examiner*—Christopher G. Young
*Assistant Examiner*—Saleha R. Mohamedulla
*Attorney, Agent, or Firm*—McDermott, Will & Emery

[57] ABSTRACT

Transmitting portions of a phase-shifting mask include plural first transmitting areas periodically arranged along a first direction and a second direction and a second transmitting area provided in an area surrounded with adjacent four first transmitting areas among the plural first transmitting areas. The first transmitting areas are formed by recessing a board so that a phase difference of substantially 180 degrees in exposure light can be caused between adjacent first transmitting areas. A phase difference of substantially 90 degrees in the exposure light is caused between the second transmitting area and the surrounding first transmitting areas. Thus, isolated patterns arranged at high density can be formed correspondingly to the first transmitting areas and the second transmitting area.

5 Claims, 10 Drawing Sheets

METHOD OF MANUFACTURING ELECTRONIC DEVICE USING PHASE-SHIFTING MASK WITH MULTIPLE PHASE-SHIFT REGIONS

BACKGROUND OF THE INVENTION

The present invention relates to a phase-shifting mask and a method of manufacturing an electronic device using the mask. More particularly, it relates to formation of contact holes arranged at a high density in manufacturing a semiconductor integrated circuit device.

A dynamic random access memory (hereinafter referred to as the DRAM) functioning as a technology driver for a semiconductor integrated circuit device has played a significant role in promoting refinement and high integration of elements in a semiconductor integrated circuit device. Now, mass production of a DRAM of 64 Mbits designed in accordance with a 0.25 μm rule has been realized. Furthermore, production of a DRAM of 1 Gbit designed in accordance with a 0.18 μm rule has been expected.

In a DRAM of 1 Gbit, it is necessary to form each memory cell in an area of approximately 0.3 $\mu m^2$, and hence, there is a demand for a cell pitch of 0.4 μm. A memory cell of an 8 $F^2$ structure used in a memory includes one storage node contact in each cell. Therefore, it is necessary to adopt a technique to form a contact hole with a diameter of approximately 0.2 μm with a pitch of 0.4 μm or less.

As a technique to improve resolution in patterning contact holes through exposure, an attenuated phase-shifting mask is proposed. In this technique, a semi-transparent film is formed in a field region of a photomask, thereby shifting the phase of the field region by 180° from the phase of a transmitting hole region. Thus, interference is caused between transmitted light of these regions, so as to sharply define a pattern edge. By adopting this technique, an isolated contact hole with a diameter of approximately 0.2 μm can be formed. In this technique, however, it is difficult to separate contact holes from one another when the pitch therebetween is smaller than approximately 0.5 μm.

Therefore, use of an alternating phase-shifting mask having a higher degree of interference has been proposed for formation of contact holes with a smaller pitch (Japanese Laid-Open Patent Publication No. 62-50811). An alternating phase-shifting mask is a photomask provided with a phase shifter to every other transmitting areas for defining contact holes to be formed, so that a phase difference of 180 degrees can be caused between light transmitted by adjacent patterns. Such a phase shifter is generally formed by etching a photomask plate. By adopting this technique, a contact hole with a pitch of approximately 0.3 μm can be formed.

The aforementioned phase-shifting mask is effective in forming a contact hole array where contact holes are periodically two-dimensionally arranged in an array of rows and columns. However, it is difficult to apply the phase shifting mask to contact holes to be formed in positions shifted from the regular matrix positions.

When a DRAM memory cell with an area of 0.3 $\mu m^2$ or smaller is to be formed, it is preferred that metal plugs are formed in a storage node contact hole and a bit line contact hole as is disclosed in, for example, IEDM '96 Technical Digest, p. 593. When these two types of contact holes are to be simultaneously formed, the storage node contact holes are regularly arranged in an array of rows and columns, but the bit line contact holes are disposed in positions shifted by a ½ pitch. Accordingly, it is difficult to form these contact holes at the same time by using the alternating phase-shifting mask. Therefore, after the storage node contact holes are formed by using the alternating phase-shifting mask, the bit line contact holes are required to be separately formed by using an attenuated phase-shifting mask or the like. As a result, discrepancy in locations of these contact holes, i.e., relative placement errors, cannot be avoided, which obstructs the development of refined memory cells.

SUMMARY OF THE INVENTION

The phase-shifting mask of this invention comprises a transparent photomask plate, an opaque portion formed in the transparent photomask plate and transmitting portions formed in the transparent photomask plate, and the transmitting portions include plural first transmitting areas periodically arranged along a first direction and a second direction different from the first direction; and at least one second transmitting area provided in an area surrounded with adjacent four first transmitting areas among the plural first transmitting areas, a phase difference of substantially 180 degrees in exposure light is caused between adjacent two first transmitting areas among the plural first transmitting areas, and a phase difference of substantially 90 degrees in the exposure light is caused between the second transmitting area and the four first transmitting areas surrounding the second transmitting area.

Preferably, a surface of at least a part of the plural first transmitting areas is positioned at a different level from a main surface of the transparent photomask plate.

Preferably, a surface of at least a part of the plural first transmitting areas is recessed to be lower than the main surface of the transparent photomask plate.

Preferably, a surface of the second transmitting area is positioned at a different level from surfaces of the plural first transmitting areas.

Preferably, the surface of the second transmitting area is positioned at the same level as the main surface of the transparent photomask plate.

Preferably, the phase difference caused between adjacent two first transmitting areas among the plural first transmitting areas is in a range between 160 degrees and 200 degrees.

Preferably, the phase difference caused between the second transmitting area and the four first transmitting areas is in a range between 70 degrees and 110 degrees.

In one aspect of the phase-shifting mask, the first direction can be perpendicular to the second direction.

In another aspect of the phase-shifting mask, each of the plural first transmitting areas has a shape for forming a hole.

In still another aspect of the phase-shifting mask, the second transmitting area has a dimension larger than a dimension of each of the first transmitting areas.

In still another aspect of the phase-shifting mask, a pitch of the first transmitting areas measured along the first direction is approximately twice as large as a pitch of the first transmitting areas measured along the second direction.

Preferably, a dimension of each of the first transmitting areas measured along the second direction is smaller than a dimension thereof measured along the first direction.

In the method of manufacturing an electronic device of this invention, a phase-shifting mask including a transparent photomask plate, an opaque portion formed in the transparent photomask plate and transmitting portions formed in the transparent photomask plate is used, the transmitting portions of the phase-shifting mask includes plural first transmitting areas periodically arranged along a first direction and a second direction different from the first direction; and at least one second transmitting area provided in an area surrounded with adjacent four first transmitting areas among the plural first transmitting areas, a phase difference of substantially 180 degrees in exposure light is caused between adjacent two first transmitting areas among the plural first transmitting areas, and a phase difference of substantially 90 degrees in the exposure light is caused between the second transmitting areas and the four first transmitting areas surrounding the second transmitting area, and the method comprises the steps of forming a resist layer on a film used for forming a part of the electronic device; irradiating the resist layer with the exposure light through the phase-shifting mask; developing the resist layer; and patterning the film partially covered with the resist layer.

In the method of manufacturing an electronic device, the electronic device can be a semiconductor integrated circuit device, and the first transmitting areas and the second transmitting area of the phase-shifting mask can define openings formed in the film.

In the method of manufacturing an electronic device, the semiconductor integrated circuit device can be a dynamic random memory, each of the first transmitting areas can define a storage node contact hole for connecting a memory cell and a storage part, and the second transmitting area can define a bit line contact hole for connecting the memory cell and a bit line.

In the method of manufacturing an electronic device, off-axis illumination can be adopted in the step of irradiating the resist layer with the exposure light through the phase-shifting mask.

Another phase-shifting mask of this invention comprises a transparent photomask plate, an opaque portion formed in the transparent photomask plate and transmitting portions formed in the transparent photomask plate, and the transmitting portions include at least four first transmitting areas; and at least one second transmitting area provided in an area surrounded with adjacent four first transmitting areas among the first transmitting areas, a phase difference of substantially 180 degrees in exposure light is caused between adjacent two first transmitting areas among the adjacent four first transmitting areas, and a phase difference of substantially 90 degrees in the exposure light is caused between the second transmitting area and the four first transmitting areas surrounding the second transmitting area, whereby patterns corresponding to the first transmitting areas and the second transmitting area are separately formed.

In another method of manufacturing an electronic device of this invention, a phase-shifting mask including a transparent photomask plate, an opaque portion formed in the transparent photomask plate and transmitting portions formed in the transparent photomask plate is used, the transmitting portions of the phase-shifting mask includes at least four first transmitting areas; and at least one second transmitting area provided in an area surrounded with adjacent four first transmitting areas among the first transmitting areas, a phase difference of substantially 180 degrees in exposure light is caused between adjacent two first transmitting areas among the adjacent four first transmitting areas, and a phase difference of substantially 90 degrees in the exposure light is caused between the second transmitting area and the four first transmitting areas surrounding the second transmitting areas, whereby patterns corresponding to the first transmitting areas and the second transmitting area are separately formed, and the method comprises an exposure step using the phase-shifting mask.

DETAILED DESCRIPTION OF THE INVENTION

Preferred embodiments of the present invention will now be described with reference to the accompanying drawings.
Embodiment 1

Figure 1:
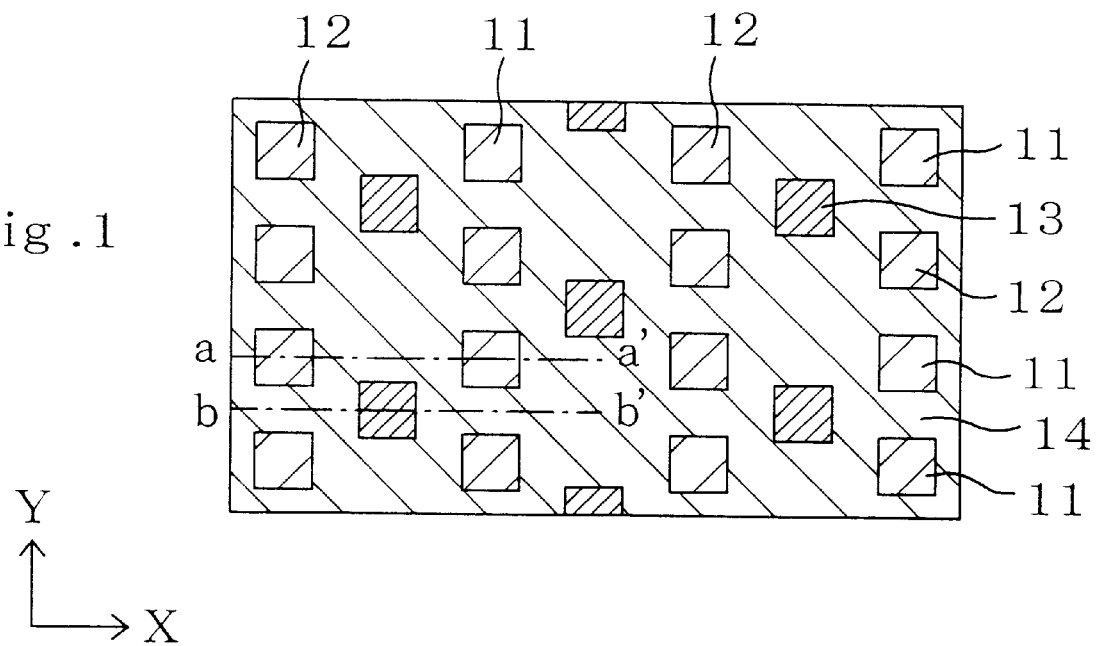
FIG. 1 is a plan view of a phase-shifting mask according to a first embodiment of the invention.

FIG. 1 shows a phase-shifting mask according to a first embodiment of the invention. As is shown in FIG. 1, the phase-shifting mask includes a transparent photomask plate (with a thickness of 0.25 inch) of glass or the like, an opaque portion 14 formed in the transparent photomask plate and transmitting portions formed in the transparent photomask plate. The opaque portion is formed by providing an opaque film on the transparent photomask plate. The opaque film is formed by patterning a metallic thin film of chromium (Cr) or the like. The transmitting portions formed as openings in the opaque film includes plural first transmitting areas 11 and 12 arranged periodically and two-dimensionally along a first direction (the X-axis direction) and a second direction (the Y-axis direction). Each of the first transmitting areas 11 and 12 has a substantially rectangular shape.

More specifically, the first transmitting areas 11 and 12 are alternately arranged with an equal pitch along the X-axis direction and the Y-axis direction. In other words, the first transmitting areas 11 and 12 are regularly and periodically arranged in an array formed by rows parallel to the X-axis direction and columns parallel to the Y-axis direction.

A pitch between the first transmitting areas 11 measured along the X-axis direction is equal to a pitch between the first transmitting areas 12 measured along the X-axis direction. A pitch between the adjacent first transmitting area 11 and first transmitting area 12 measured along the X-axis direction is equal to a pitch between the adjacent columns along the X-axis direction. On the other hand, a pitch between the first transmitting areas 11 measured along the Y-axis direction is equal to a pitch between the first transmitting areas 12 measured along the Y-axis direction. A pitch between the adjacent first transmitting area 11 and first transmitting area 12 arranged in the Y-axis direction is equal to a pitch between the adjacent rows.

The mask is provided with a phase-shifting structure (phase shifters) so that the phase of light transmitted by the first transmitting area 11 can be different from the phase of light transmitted by the first transmitting area 12. In this embodiment, for the purpose of causing the phase difference, the main surface of the transparent photomask plate is provided with steps by etching a part of the main surface, so that the surface of the first transmitting area 11 can be positioned at a different level from the surface of the first transmitting area 12. This structure will be described in detail below.

The transmitting portions further include second transmitting areas 13 each formed in an area surrounded with the adjacent four first transmitting areas 11 and 12. The second transmitting areas 13 are also formed in areas corresponding to openings in the opaque film similarly to the first transmitting areas 11 and 12. The surface of the second transmitting area 13 is positioned at a different level from the surfaces of the first transmitting areas 11 and 12, so that a phase difference can be caused between the second transmitting area 13 and the first transmitting areas 11 and 12. The differences in the levels of the surfaces of the transmitting areas 11 through 13 are determined in consideration of a wavelength of light used for exposure and a refractive index of the transparent photomask plate. The level differences in the surfaces of the transmitting areas 11 through 13 are caused not only by recessing the main surface of the photomask plate by etching or the like but also by depositing a phase-shifting thin film on a predetermined area on the main surface of the photomask plate. When the level differences are caused in the surfaces of the transmitting areas 11 through 13, a difference is caused in an optical path of exposure light when the transparent photomask plate transmits the light, resulting in causing light interference. This light interference plays a significant role in the formation of a pattern by using the phase-shifting mask of this invention.

The plan layout of the transmitting areas 11, 12 and 13 is designed so as to form a pattern of contact holes in the exposure using the phase-shifting mask of this embodiment. Owing to the phase-shifting structure provided to the transparent photomask plate, a phase difference of 90 degrees is caused between the first transmitting area 11 and the second transmitting area 13 and a phase difference of 90 degrees is also caused between the first transmitting area 12 and the second transmitting area 13. Furthermore, a phase difference of 180 degrees is caused between the first transmitting area 11 and the first transmitting area 12.

Each of the transmitting areas 11 through 13 of this embodiment is formed in a square with a side of 0.23 $\mu$m (hereinafter referred to as a 0.23 $\mu$m square). The pitch between the first transmitting area 11 and the first transmitting area 12 adjacent to each other along the X-axis direction is set at 0.68 $\mu$m, and the pitch between the first transmitting area 11 and the first transmitting area 12 adjacent to each other along the Y-axis direction is set at 0.34 $\mu$m. Each of the second transmitting areas 13 is formed at the center of an area surrounded with adjacent four first transmitting areas 11 and 12. In this case, the phase-shifting structure is designed so that a KrF laser with a wavelength of 248 nm can be used as a source of the exposure light. In the phase-shifting mask of this embodiment, since 1/5 reduction projection exposure is adopted, the dimensions of respective patterns on the photomask plate are five times as large as the dimensions of patterns to be transferred onto a resist mask. Accordingly, the actual dimension of each of the transmitting areas 11 through 13 is 0.23 $\mu$m×5, but for the purpose of avoiding confusion, the dimensions of the patterns on the phase-shifting mask are herein described by using the dimensions of the patterns formed through the projection exposure.

Figure 2:
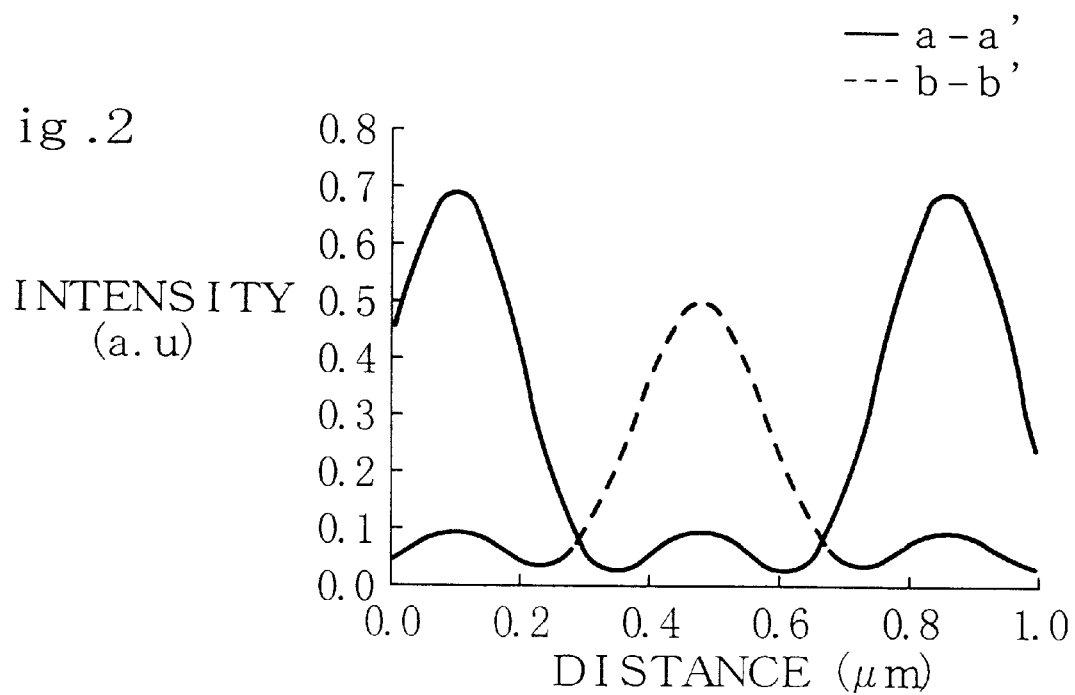
FIG. 2 is a graph for showing a spacial distribution of transmitted light intensity obtained through simulation using the phase-shifting mask of FIG. 1.

FIG. 2 shows a spacial distribution of intensity of light transmitted by the phase-shifting mask of FIG. 1 obtained by using a light intensity simulator. In FIG. 2, a solid line indicates the intensity of light obtained in a position corresponding to a line a-a' in FIG. 1, and a broken line indicates the intensity of light obtained in a position corresponding to a line b-b' in FIG. 1. As is obvious from FIG. 2, a light intensity peak with a strong contrast appears in the first transmitting areas 11 and 12 according to the principle of the alternating phase-shifting mask. Also, it is confirmed that a light intensity peak with a comparatively strong contrast appears also in the second transmitting area 13.

Figure 3A:
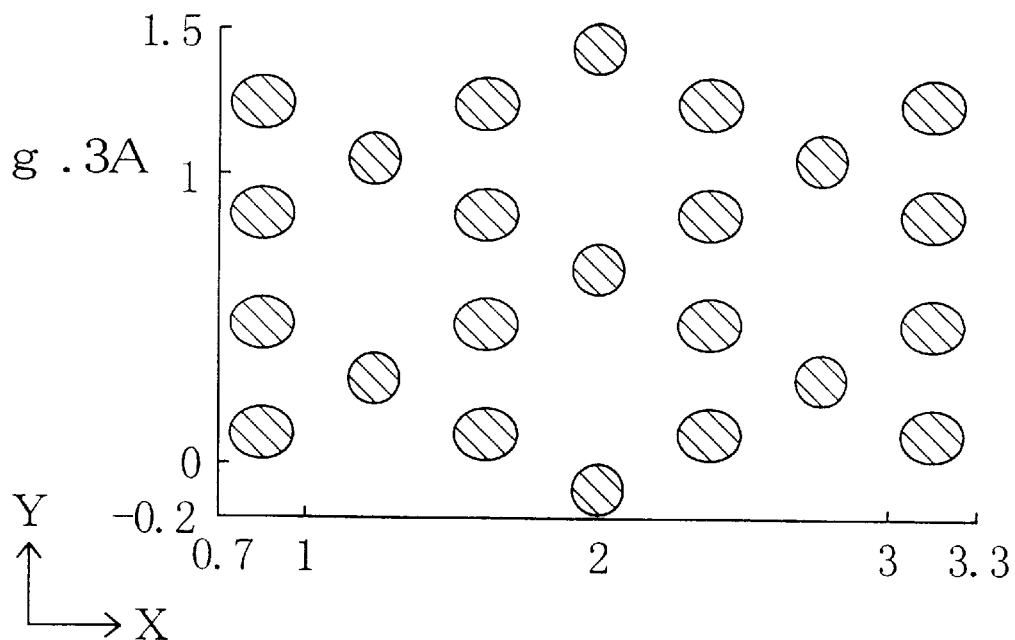
FIG. 3A is a plan view for showing an exposure pattern formed by using the phase-shifting mask of FIG. 1 obtained through simulation and FIG. 3B is a plan layout diagram for schematically showing an exemplified relationship between an active area and a contact hole in a memory cell array of a DRAM manufactured by using the phase-shifting mask of FIG. 1.
Figure 3B:
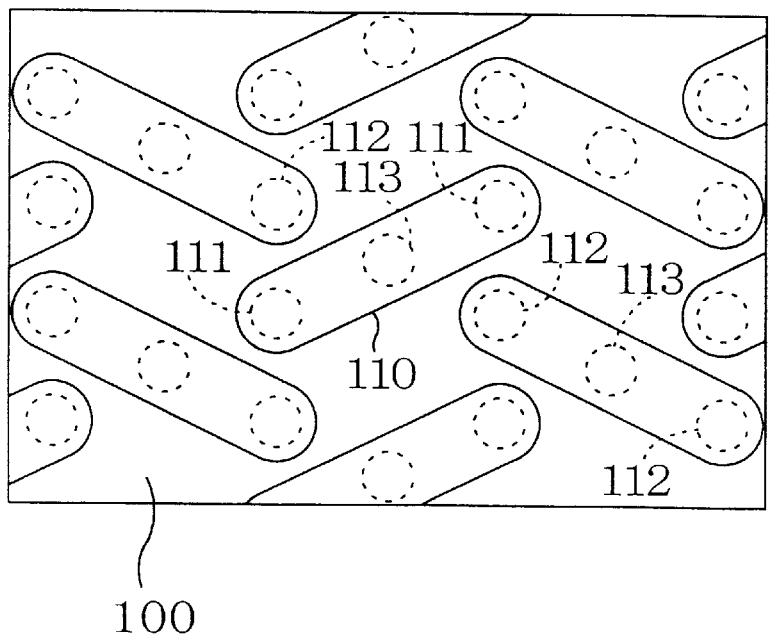

FIG. 3A shows an exposure pattern obtained through exposure of a negative resist by using the phase-shifting mask of FIG. 1. In this exposure, a threshold intensity is set at 0.35. As is shown in FIG. 3A, openings in the resist can be formed not only in positions regularly arranged in an array of rows and columns but also in shifted positions. FIG. 3B is a plan layout diagram for schematically showing an exemplified relationship between an active area of a memory cell array and a contact hole in a DRAM manufactured by using the phase-shifting mask of FIG. 1. In each of active areas 110, two transistors are formed, and as is shown in FIG. 3B, three contact holes are disposed in each active area 110. A contact hole 111 is formed by light transmitted by the first transmitting area 11 of FIG. 1, and a contact hole 112 is formed by light transmitted by the first transmitting area 12 of FIG. 1. These contact holes 111 and 112 are used for interconnecting a source and a storage electrode (not shown) in the active area 110. Also, a contact hole 113 is formed by light transmitted by the second transmitting area 13 of FIG. 1, and is used for interconnecting a drain and a bit line (not shown) positioned at the center of the active area 110. The respective active areas 110 are separated from one another by an isolation 100.

In this manner, when the phase-shifting mask of this embodiment is used, an opening array pattern, in which openings each with a small diameter of approximately 0.2

μm are arranged with a small pitch of 0.4 μm or less, can be formed owing to the first transmitting areas regularly arranged in an array of rows and columns for attaining an alternating phase-shifting structure and the second transmitting area formed in an area surrounded with the first transmitting areas and having a phase difference of 90 degrees from the surrounding first transmitting areas.

Herein, "a phase difference of 180 degrees" means a phase difference of 360°×N±180°, and "a phase difference of 90 degrees" means a phase difference of 360°×M±90° (wherein N and M are arbitrary integers). Also, "a phase difference of substantially 180 degrees" widely includes a phase difference at which a pattern that cannot be resolved without the phase difference can be resolved according to the principle of an alternating phase-shifting mask. Furthermore, "a phase difference of substantially 90 degrees" widely includes a phase difference at which light transmitted by the aforementioned second transmitting area can form a pattern. According to a result of simulation, a phase difference between the adjacent two first transmitting areas is preferably in a range between 160 degrees and 200 degrees. Also, a phase difference between the second transmitting area and the surrounding first transmitting areas is preferably in a range between 70 degrees and 110 degrees.

Embodiment 2

A phase-shifting mask according to a second embodiment of the invention will now be described with reference to FIGS. 4 through 6.

Figure 4:
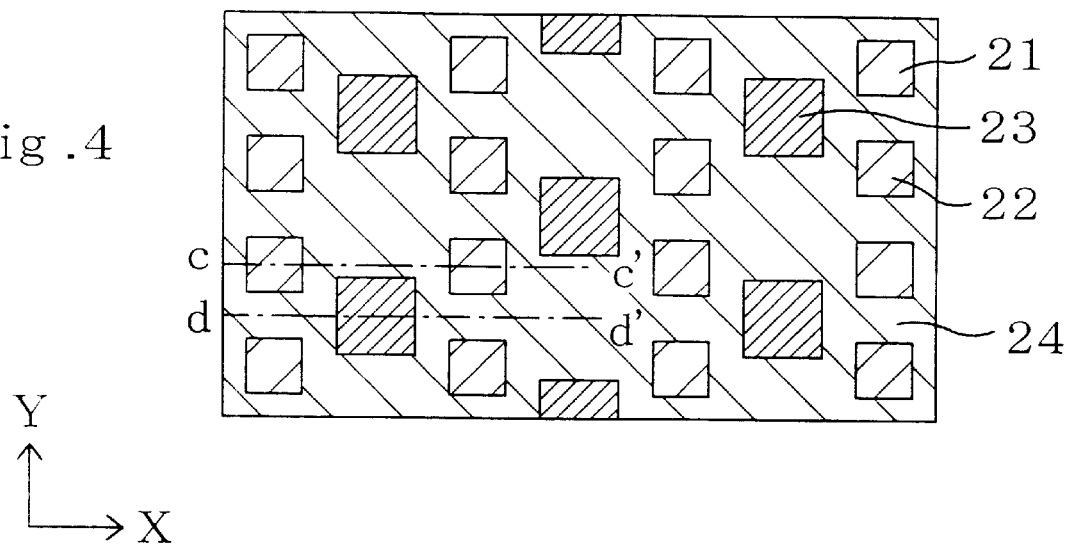
FIG. 4 is a plan view of a phase-shifting mask according to a second embodiment of the invention.

The phase-shifting mask of this embodiment shown in FIG. 4 includes, similarly to the phase-shifting mask of FIG. 1, a transparent photomask plate, an opaque portion 24 formed in the transparent photomask plate and transmitting portions formed in the transparent photomask plate. The transmitting portions formed as openings in an opaque film used as the opaque portion include plural first transmitting areas 21 and 22 arranged periodically and two-dimensionally along a first direction (the X-axis direction) and a second direction (the Y-axis direction). Each of the first transmitting areas 21 and 22 has a substantially rectangular shape.

The dimensions and locations of the first transmitting areas 21 and 22 are the same as those of the first transmitting areas 11 and 12 of the phase-shifting mask of the first embodiment shown in FIG. 1. Differently from the first embodiment, as is obvious from comparison between FIGS. 4 and 1, each of second transmitting areas 23 has a dimension (0.27 μm square) larger than the dimension of the first transmitting areas 21 and 22 (0.23 μm square) in this embodiment.

Figure 5:
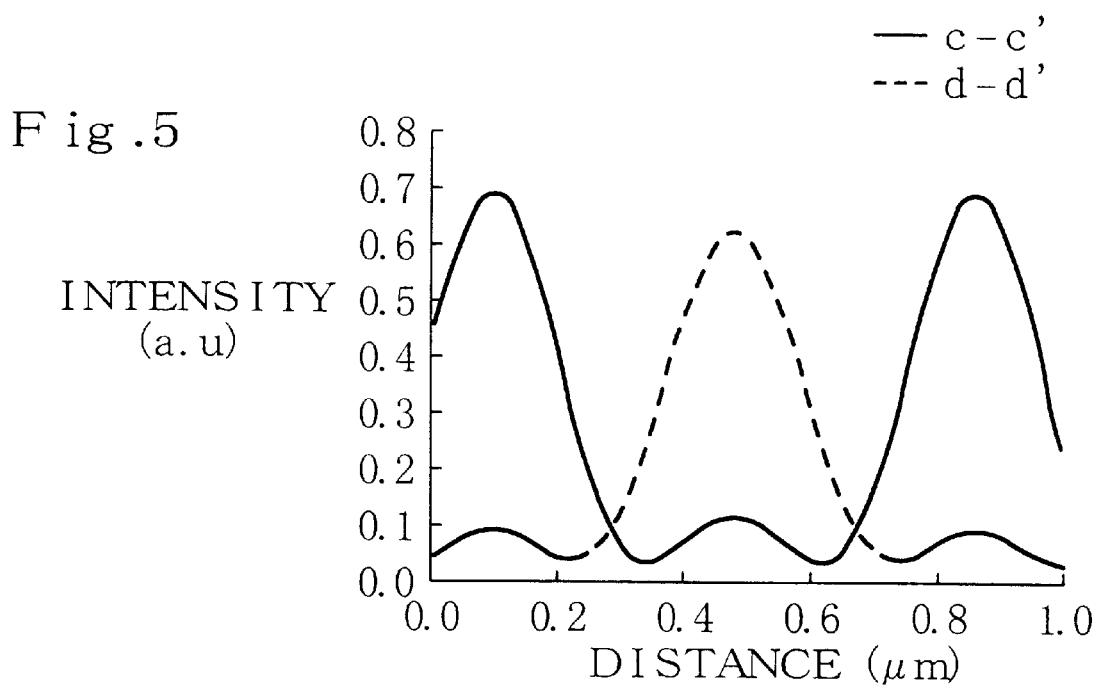
FIG. 5 is a graph for showing a spacial distribution of transmitted light intensity obtained through simulation using the phase-shifting mask of FIG. 4.

FIG. 5 shows an intensity spacial distribution of light transmitted by the phase-shifting mask of FIG. 4 obtained by using a light intensity simulator. In FIG. 5, a solid line indicates light intensity obtained in a position corresponding to a line c-c' in FIG. 4, and a broken line indicates light intensity obtained in a position corresponding to a line d-d' in FIG. 4. As is obvious from FIG. 5, a light intensity peak with a strong contrast appears in the first transmitting areas 21 and 22 in accordance with the principle of an alternating phase-shifting mask. Also, it is confirmed that a light intensity peak with a comparatively strong contrast appears in the second transmitting area 23. Since the dimension of the second transmitting area 23 is thus increased in this embodiment, the value of the light intensity peak appearing in the second transmitting area 23 can be increased to be substantially the same as the value of the light intensity peak appearing in the first transmitting areas 21 and 22.

Figure 6:
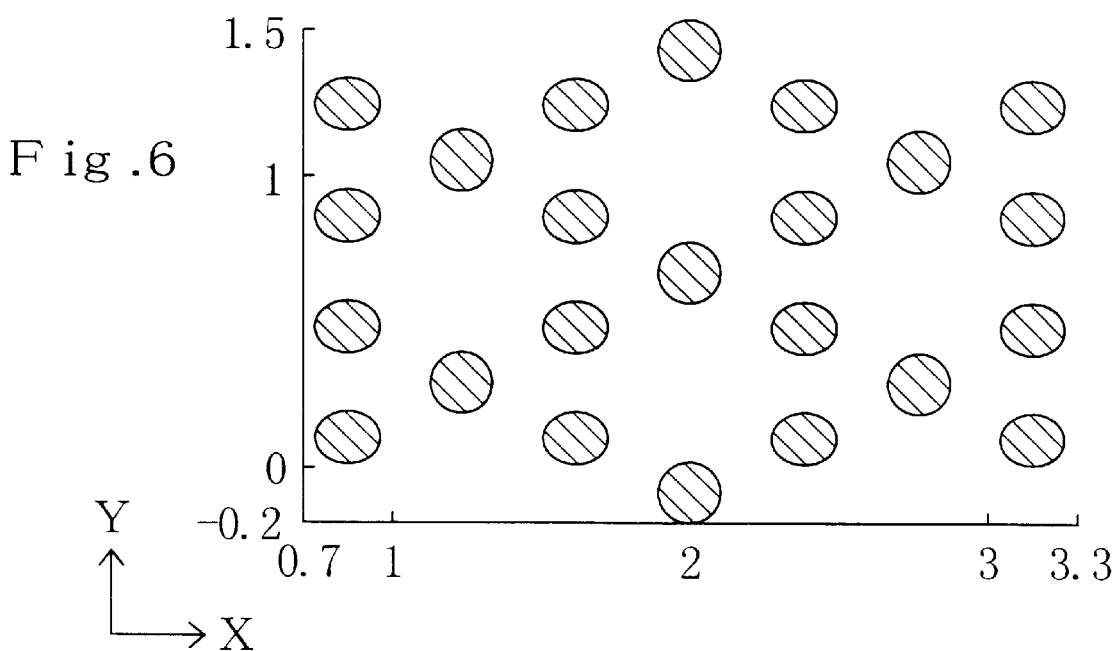
FIG. 6 is a plan view for showing an exposure pattern formed by using the phase-shifting mask of FIG. 4 obtained through simulation.

FIG. 6 shows an exposure pattern obtained through exposure of a negative resist by using the phase-shifting mask of FIG. 4. In this exposure, a threshold intensity is set at 0.35. Thus, openings in the resist can be formed in the positions regularly arranged in an array of rows and columns as well as openings substantially the same size can be formed in shifted positions.

In this manner, when the phase-shifting mask of this embodiment is used, an opening pattern, in which openings each having substantially the same size with a small diameter of approximately 0.2 μm are arranged with a small pitch of 0.4 μm or less, can be formed owing to the first transmitting areas regularly arranged in an array of rows and columns for attaining an alternating phase-shifting structure and the second transmitting area formed in an area surrounded with the first transmitting areas and having a phase difference of 90 degrees from the surrounding first transmitting areas.

Embodiment 3

A phase-shifting mask according to a third embodiment of the invention will now be described with reference to FIGS. 7 through 9.

Figure 7:
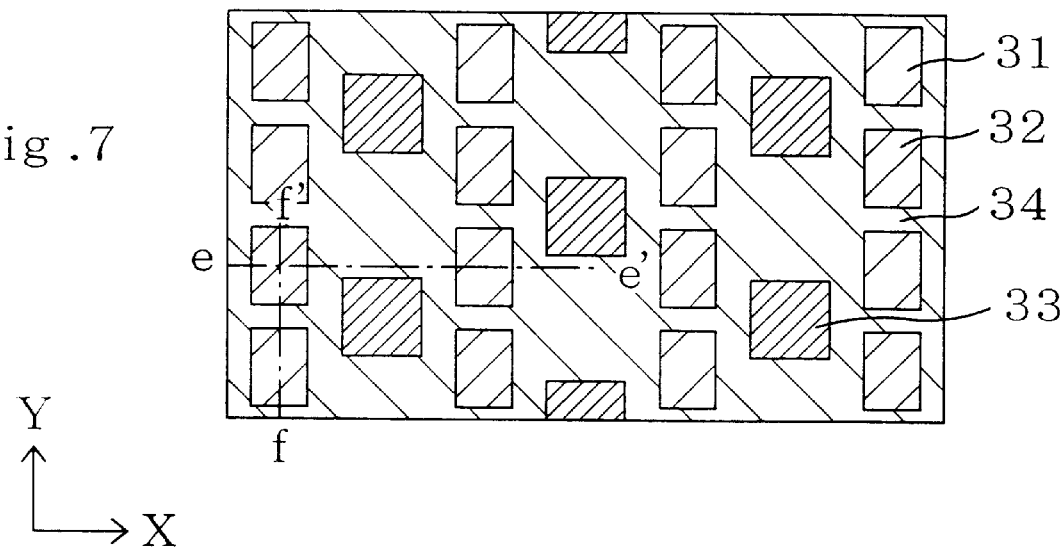
FIG. 7 is a plan view of a phase-shifting mask according to a third embodiment of the invention.

The phase-shifting mask of this embodiment shown in FIG. 7 includes, similarly to the phase-shifting mask of FIG. 4, a transparent photomask plate, an opaque portion 34 formed in the transparent photomask plate and transmitting portions formed in the transparent photomask plate. The transmitting portions formed as openings in an opaque film used as the opaque portion include plural first transmitting areas 31 and 32 arranged periodically and two-dimensionally along a first direction (the X-axis direction) and a second direction (the Y-axis direction). Each of the first transmitting areas 31 and 32 has a substantially rectangular shape.

The locations of the first transmitting areas 31 and 32 are the same as those of the first transmitting areas 21 and 22 of the phase-shifting mask of the second embodiment shown in FIG. 4. Differently from the second embodiment, as is obvious from comparison between FIG. 7 and FIG. 4, the shape and the dimension of the first transmitting areas 31 and 32 of this embodiment are different from those of the first transmitting areas 21 and 22 of the second embodiment. More specifically, the dimension of each of the first transmitting areas 31 and 32 measured along the Y-axis direction (i.e., 0.22 μm) is larger than the dimension thereof measured along the X-axis direction (i.e., 0.19 μm) in this embodiment.

Figure 8:
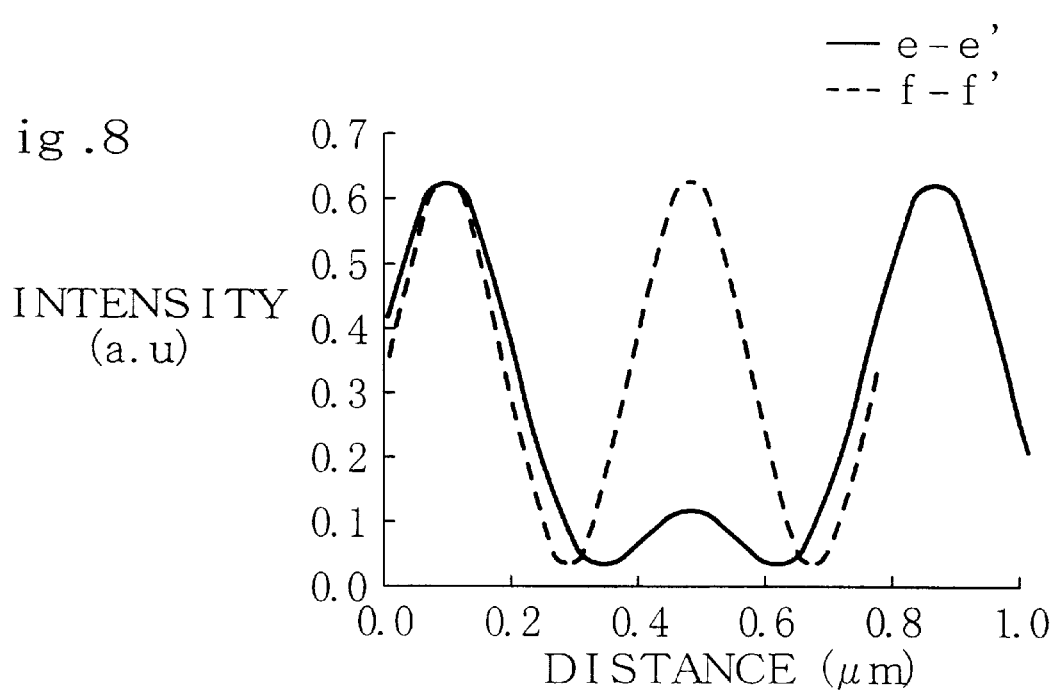
FIG. 8 is a graph for showing a spacial distribution of transmitted light intensity obtained through simulation using the phase-shifting mask of FIG. 7.

FIG. 8 shows an intensity spacial distribution of light transmitted by the phase-shifting mask of FIG. 7 obtained by using a light intensity simulator. In FIG. 8, a solid line indicates the light intensity obtained in a position corresponding to a line e-e' of FIG. 7, and a broken line indicates the light intensity obtained in a position corresponding to a line f-f' of FIG. 7. As is obvious from FIG. 8, a light intensity peak having a strong contrast appears in the first transmitting areas 31 and 32 according to the principle of an alternating phase-shifting mask.

Since the first transmitting areas 31 and 32 are arranged with a smaller pitch along the Y-axis direction, the interference between light transmitted by the adjacent transmitting areas along the Y-axis direction is enhanced. Accordingly, while the exposure pattern is elongated in the X-axis direction in FIGS. 3A and 6, a comparatively round exposure pattern can be obtained in this embodiment because the dimension of each of the first transmitting areas 31 and 32 along the Y-axis direction is larger than that along the X-axis direction.

Figure 9:
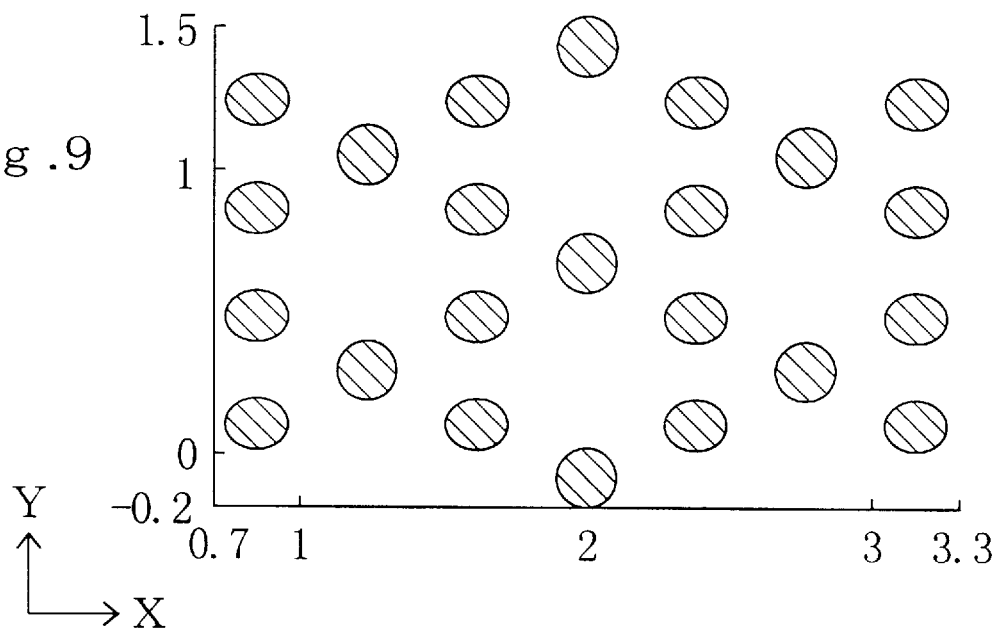
FIG. 9 is a plan view for showing an exposure pattern formed by using the phase-shifting mask of FIG. 7 obtained through simulation.

FIG. 9 shows an exposure pattern obtained through exposure of a negative resist by using the phase-shifting mask of FIG. 7. In this exposure, a threshold intensity is set at 0.35. In this manner, round openings arranged regularly in an array of rows and columns can be formed as well as openings substantially the same size can be formed in shifted positions.

In this manner, when the phase-shifting mask of this embodiment is used, an opening pattern, in which round openings each having substantially the same size with a small diameter of approximately 0.2 μm are arranged with a small pitch of 0.4 μm or less, can be formed owing to the first transmitting areas regularly arranged in an array of rows and columns for attaining an alternating phase-shifting structure and the second transmitting area formed in an area surrounded with the first transmitting areas and having a phase difference of 90 degrees from the surrounding first transmitting areas.

Embodiment 4

Figure 10:
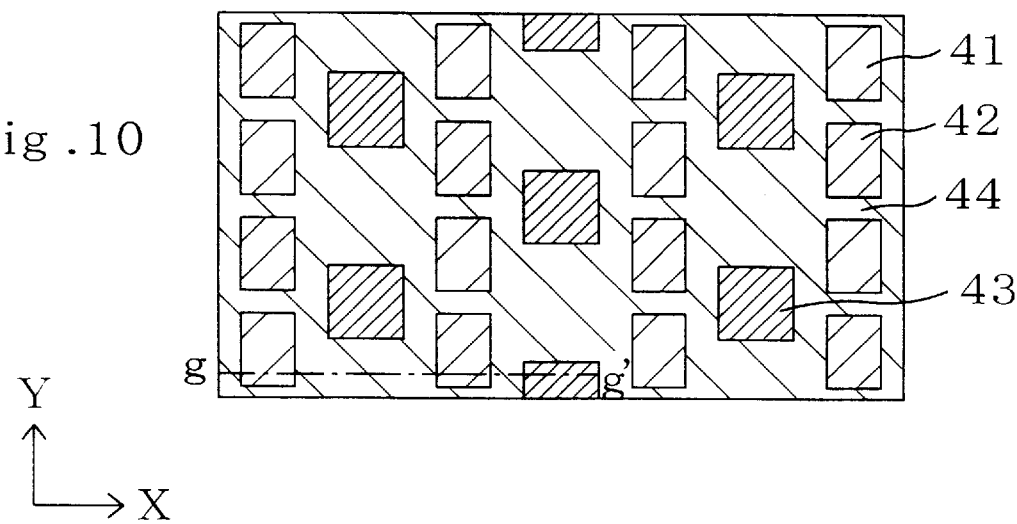
FIG. 10 is a plan view of a phase-shifting mask according to a fourth embodiment of the invention.

FIG. 10 is a plan view for showing a phase-shifting mask according to a fourth embodiment of the invention. The phase-shifting mask of FIG. 10 includes, similarly to the phase-shifting mask of FIG. 7, a transparent photomask plate, an opaque portion 44 formed in the transparent photomask plate and transmitting portions formed in the transparent photomask plate. The transmitting portions formed as openings in an opaque film used as the opaque portion include transmitting areas 41, 42 and 43 and the plan layout of these transmitting areas 41, 42 and 43 is the same as that of the transmitting areas 31, 32 and 33 of the third embodiment.

Figure 11:
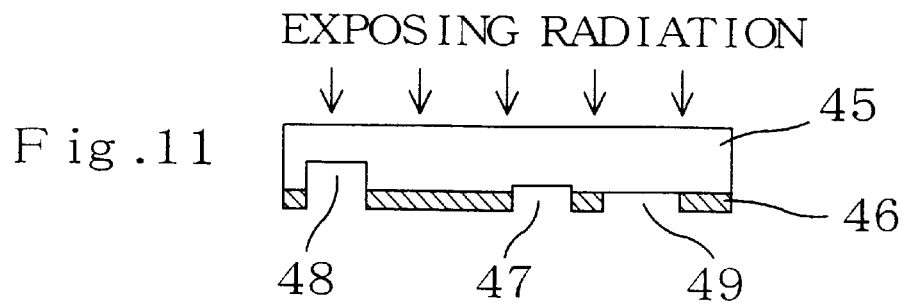
FIG. 11 is a sectional view of the phase-shifting mask of the fourth embodiment.

FIG. 11 is a sectional view of the phase-shifting mask taken on line g-g' of FIG. 10. As is shown in FIG. 11, the main surface of the transparent photomask plate 45 is partially covered with a shading material film 46 of a Cr film or the like. On the main surface of the transparent photomask plate 45, portions 47, 48 and 49 not covered with the opaque material film 46 respectively correspond to the first transmitting areas 41 and 42 and the second transmitting area 43.

A recess type phase-shifting structure is formed by recessing the transparent photomask plate 45 through etching or the like from its main surface to a given depth. Through such a recess, the thickness of the transparent photomask plate 45 is varied in the transmitting areas, thereby causing a difference in the optical path. As a result, a phase difference is caused in light transmitted by the respective transmitting areas.

When a wavelength of exposure light is indicated as λ, the refractive index of the photomask plate 45 is indicated as n and the depth of a recess in the photomask plate 45 is indicated as d, a phase difference x is given as x=360/d (n−1). In this embodiment, the portion 49 in the photomask plate 45 corresponding to the second transmitting area 43 is not recessed with the portion 47 corresponding to the first transmitting area 41 recessed to a depth of λ(n−1)/4, and with the portion 48 corresponding to the first transmitting area 42 recessed to a depth of 3λ(n−1)/4. In this manner, a phase difference of 90 degrees is caused between the portion 47 and the portion 49 and between the portion 48 and the portion 49, and a phase difference of 180 degrees is caused between the portion 47 and the portion 48.

In the recess type phase-shifting structure, micro-roughness can be formed on the etched surface resulting from the etching of the photomask plate 45, so that the light transmittance in the rough surface portion can be degraded. In this embodiment, however, the second transmitting area 43 is not etched, and hence, no micro-roughness is caused in the second transmitting area 43. Therefore, the light transmittance in the second transmitting area 43 can be prevented from being degraded as compared with that of the other areas. When the second transmitting area 43 is formed by etching the main surface of the photomask plate 45, the degradation in the light transmittance caused in the second transmitting area 43 can largely affect the formation of the exposure pattern.

Figure 12:
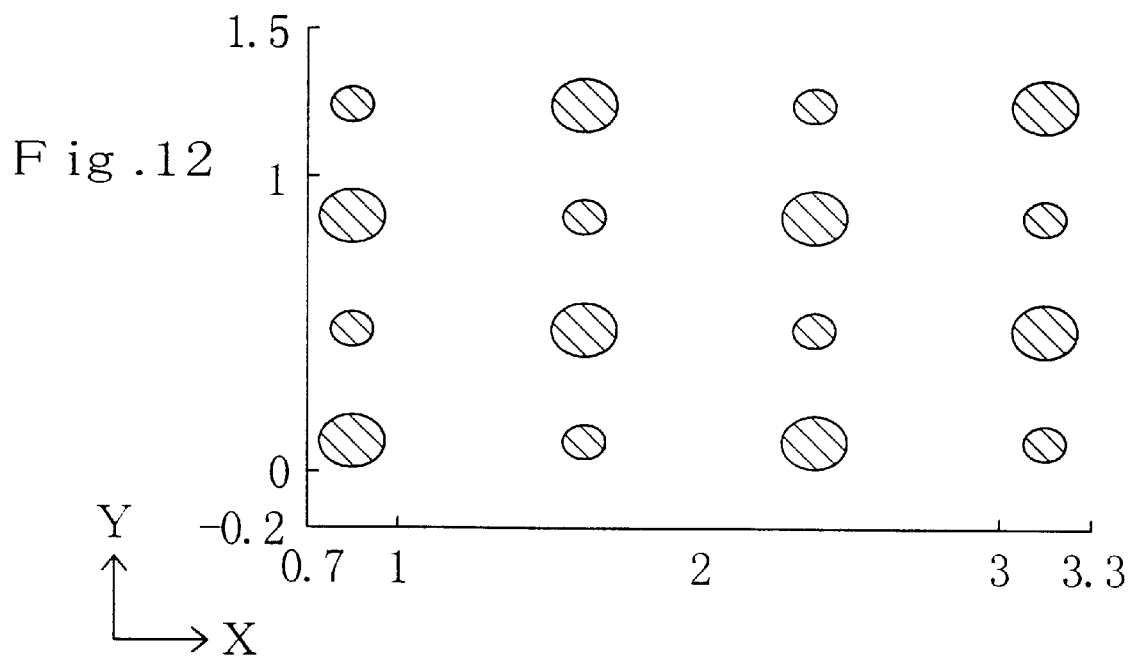
FIG. 12 is a plan view for showing an exposure pattern formed by a modification of the phase-shifting mask of FIG. 10 obtained through simulation.

FIG. 12 shows an exposure pattern obtained by using a phase-shifting mask in which the portions 48 and 49 respectively corresponding to the first transmitting areas 41 and the second transmitting area 43 are recessed with the portion 47 corresponding to the first transmitting area 42 not recessed. This exposure pattern is obtained by using a light intensity simulator. In this simulation, a threshold intensity in the exposure is set at 0.35, the light transmittance of the portion 48 of the photomask plate 45 is set at 0.8 and the light transmittance of the portions 47 and 49 is set at 1. The plan layout of these transmitting areas is the same as that of the fourth embodiment.

Figure 13:
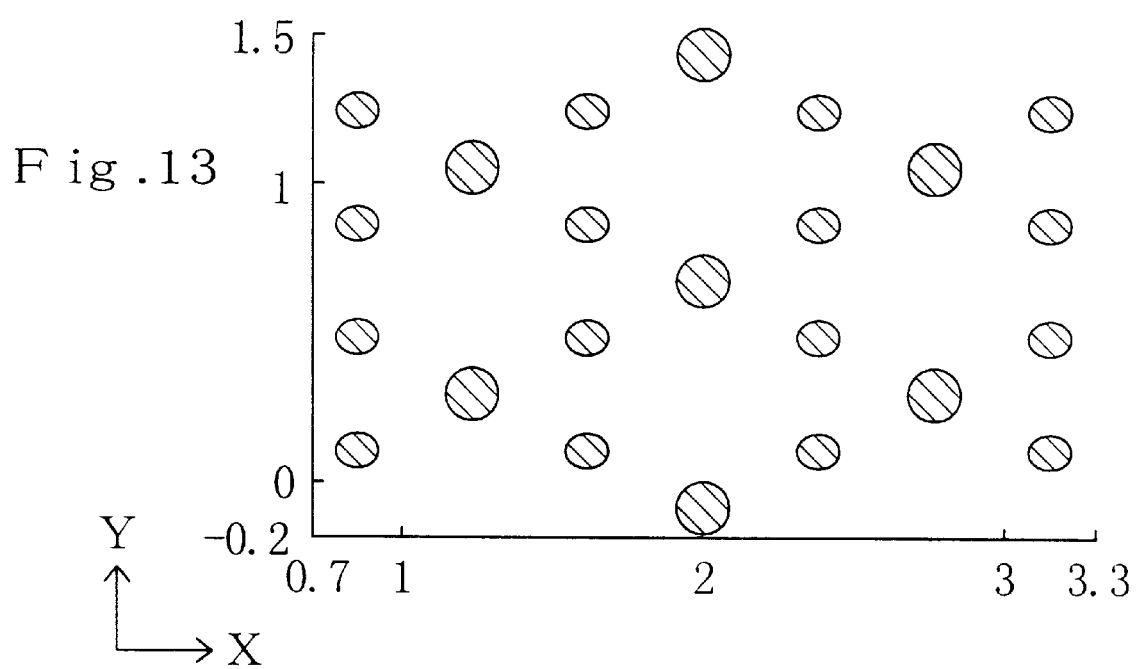
FIG. 13 is a plan view for showing an exposure pattern formed by the phase-shifting mask of FIG. 10 obtained through simulation.

As is obvious from FIG. 12, openings formed correspondingly to the first transmitting areas 41 and 42 have different dimensions, and an opening corresponding to the second transmitting area 43 is not formed. In contrast, when the phase-shifting mask of the fourth embodiment is used, openings formed correspondingly to the first transmitting areas 41 and 42 have the same dimension as is shown in FIG. 13. In simulation by using the phase-shifting mask of the fourth embodiment, the light transmittance of the portions 47 and 48 is set at 0.8 and the light transmittance of the portion 49 is set at 1.

In this manner, when the phase-shifting mask of this embodiment is used, an opening pattern, in which round openings each having substantially the same size with a small diameter of approximately 0.2 μm are arranged with a small pitch of 0.4 μm or less, can be formed at high accuracy owing to the first transmitting areas formed by recessing and regularly arranged in an array of rows and columns for attaining an alternating phase-shifting structure and the second transmitting area formed without recessing in an area surrounded with the first transmitting areas and having a phase difference of 90 degrees from the surrounding first transmitting areas.

Embodiment 5

A method of manufacturing an electronic device according to a fifth embodiment of the invention will now be described with reference to FIGS. 14A through 14F. In this embodiment, a DRAM including refined memory cells is exemplified as the electronic device.

Figure 14A:
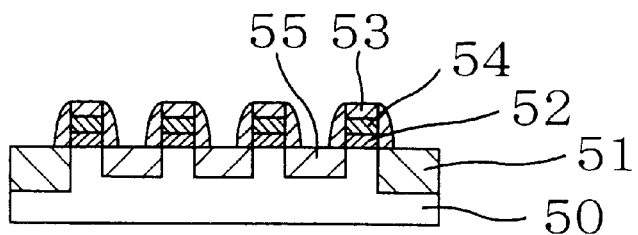
FIGS. 14A through 14F are sectional views for showing procedures in a method of manufacturing an electronic device according to the invention.

First, after forming an isolation region 51 in a semiconductor substrate 50 by a known manufacturing method for a semiconductor integrated circuit device as is shown in FIG. 14A, word lines of MOS transistors are formed in the p-type semiconductor substrate 50. Each word line includes, for example, a polysilicon film 52 and a tungsten silicide film 54 that are capped with a nitride film 53. After depositing a nitride film on the substrate 50 so as to cover the word lines, the nitride film is etched back from its surface, thereby forming a sidewall spacer of the nitride film at the side of the word line. Subsequently, for example, phosphorus (P) ions are implanted at $2 \times 10^{13}$ cm$^{-2}$ into the substrate 50 at an acceleration energy of 10 keV, thereby forming a low concentration n-type diffusion region 55 in the substrate 50.

Figure 14B:
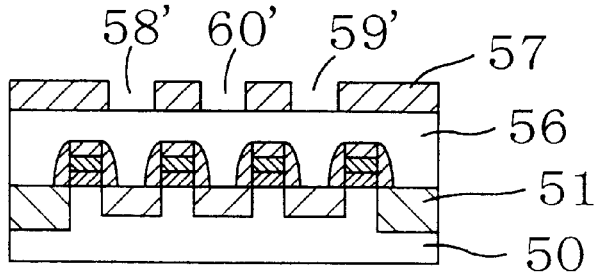

Next, as is shown in FIG. 14B, after forming a first interlevel insulating film 56 covering the transistor structure, a photoresist 57 is patterned by the lithography using a phase-shifting mask of the present invention. At this point, the transmitting areas 11, 12 and 13 shown in FIG. 1 respectively define openings 58', 59' and 60' of the resist 57. In FIG. 14B, merely three openings 58', 59' and 60' are shown but a large number of openings are actually formed as is shown in the plan layout of FIG. 3. The openings 58' and 59' correspond to the first transmitting areas of the phase-shifting mask, and the opening 60' corresponds to the second transmitting area. Each of the openings 58' and 59' formed in this embodiment has a dimension of 0.24 μm, the opening 60' has a dimension of 0.28 μm, and the minimum pitch between the openings 58' through 60' is 0.38 μm.

Figure 14C:
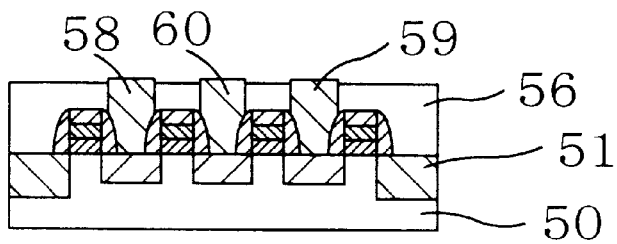

Next, as is shown in FIG. 14C, holes are formed in the first interlevel insulating film 56 by using the photoresist 57 as an etching mask, and the holes are then buried with an n-type polysilicon film. Then, the surfaces of the n-type polysilicon film and the interlevel insulating film 56 are planarized by CMP (chemical mechanical polishing), and storage node contact holes are buried with plugs 58 and 59 and a bit line contact hole is buried with a plug 60. The plugs 58 through 60 are formed out of the n-type polysilicon film.

Figure 14D:
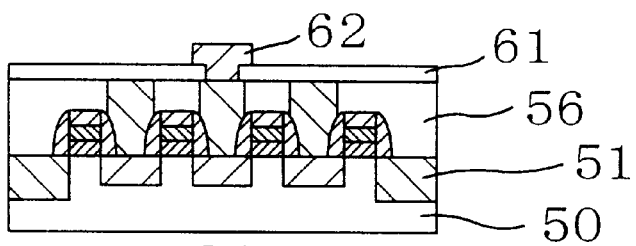

Then, as is shown in FIG. 14D, after an insulating film 61 is deposited on the first interlevel insulating film 56, a contact hole for the plug 60 is formed in the insulating film 61. After a tungsten film is deposited on the insulating film 61, the tungsten film is patterned, thereby forming a bit line 62. The bit line 62 is in contact with the plug 60 through the opening of the insulating film 61.

Figure 14E:
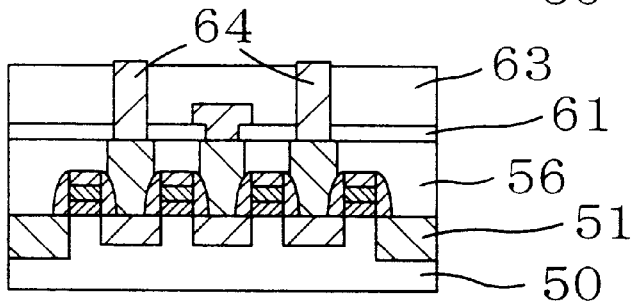

Subsequently, as is shown in FIG. 14E, a second interlevel insulating film 63 is deposited on the insulating film 61 so as to cover the bit line 62, and then, contact holes for the plugs 58 and 59 are formed in the second interlevel insulating film 63. Then, after these contact holes are buried with an n-type polysilicon film, the surface is planarized by the CMP, and a storage node contact 64 is formed.

Figure 14F:
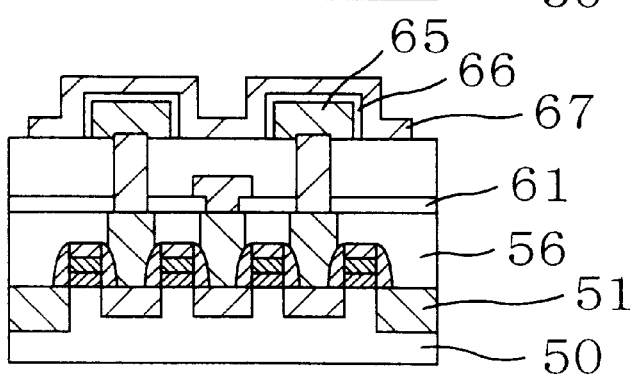

Next, as is shown in FIG. 14F, a storage electrode 65, a capacitance insulating film 66 and a plate electrode 67 are formed on the second interlevel insulating film 63. The storage electrode 65 is electrically connected with the plug 58 or 59 in the first interlevel insulating film through the storage node contact 64.

According to this manufacturing method, the storage node contact holes can be formed with a small pitch of 0.4 μm or less, and the bit line contact holes can be simultaneously formed in positions shifted from the storage node contact holes by a ½ pitch. As a result, one refined memory cell can be formed in an area smaller than 0.3 μm², thereby realizing the integration of a 1 Gbit DRAM.

Figure 15A:
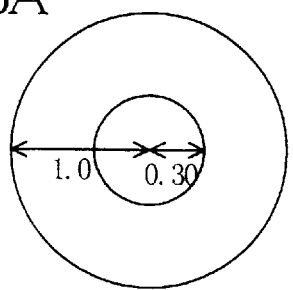
FIG. 15A is a plan view of an aperture used in on-axis illumination.
Figure 15B:
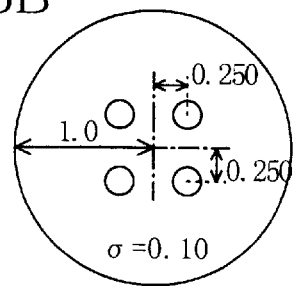
FIG. 15B is a plan view of an aperture used in off-axis illumination.
Figure 15C:
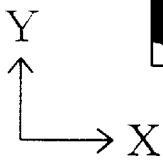
FIG. 15C is a plan view of a transfer pattern formed through exposure by the on-axis illumination and FIG. 15D is a plan view of a transfer pattern formed through exposure by the off-axis illumination.
Figure 15C:
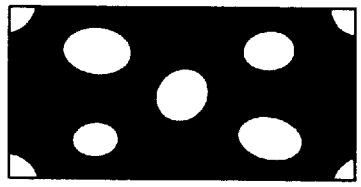
Figure 15D:
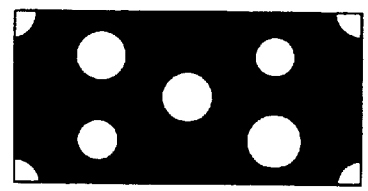

In the exposure conducted in each of the aforementioned embodiments, an aperture in the shape as is shown in FIG. 15A is used. Numerals shown in FIG. 15A correspond to the ratios of the position and the size of an opening to a radius of a disk-shaped opaque portion of the aperture. In stead of using the aperture as is shown in FIG. 15A, an aperture in the shape as is shown in FIG. 15B can be used. Illumination conducted by using the aperture of FIG. 15A can be designated as on-axis illumination, and illumination conducted by using the aperture of FIG. 15B can be designated as off-axis illumination. The off-axis illumination can include another form. The aperture of FIG. 15B has four openings. In the on-axis illumination, when a focus error is caused during the exposure, the transfer pattern can be distorted as is shown in FIG. 15C. However, in the off-axis illumination, even when a focus error is caused during the exposure, a well-shaped transfer pattern with less distortion can be obtained as is shown in FIG. 15D. The transfer patterns of FIGS. 15C and 15D are obtained through simulation.

The phase-shifting mask of this invention is widely applicable to a layout including a large number of isolated patterns regularly arranged in an array of rows and columns and another isolated pattern disposed in a position shifted from the former isolated patterns. Specifically, each of the transmitting areas is not required to correspond to an opening for a contact hole or the like. For example, a light transmitting area can correspond to a fine structure such as a quantum dot.

Also, the phase-shifting mask of this invention is applicable to a plan layout in which at least four isolated patterns and another pattern surrounded with the four isolated patterns are disposed close to one another.

Furthermore, the phase-shifting mask of this invention can be used in another process than the exposure of a resist. For example, in a thin film depositing process or an etching process, a kind of exposure can be conducted by using the phase-shifting mask of this invention, thereby providing the thin film depositing or etching process with an optical effect. A degree of the influence of such an optical effect on the process is varied in accordance with a light intensity spacial distribution on a plane, and hence, a fine structure can be thus formed.

In the phase-shifting mask of this invention, adjacent two first transmitting areas mutually cause a phase difference of substantially 180 degrees in exposure light and a second transmitting area and surrounding four first transmitting areas cause a phase difference of substantially 90 degrees in the exposure light. Accordingly, isolated patterns regularly arranged in an array of rows and columns and an isolated pattern disposed in positions shifted from the former isolated patterns can be simultaneously formed through the exposure.

In this manner, by providing the phase difference of 90 degrees, a pattern with a high resolution can be transferred onto an irregular position close to other patterns, in which a pattern cannot be formed by using a conventional alternating phase-shifting mask. This can be very effective in the formation of a contact hole pattern including irregularly arranged holes at a high density in, particularly, a semiconductor integrated circuit device.

What is claimed is:

1. A method of manufacturing an electronic device using a phase-shifting mask including a transparent photomask plate, an opaque portion formed of an opaque film on said transparent photomask plate and transmitting portions formed of openings in said opaque film, said transmitting portions of said phase-shifting mask including:

plural first transmitting areas periodically arranged with said opaque portion disposed therebetween, said plural transmitting areas arranged along a first direction and a second direction different from said first direction; and at least one second transmitting area provided in a central portion of an area surrounded with four first transmitting areas which are adjacent to each other along said first and second directions among said plural first transmitting areas, said second transmitting area and each of said four first transmitting areas surrounding said second transmitting area being arranged with said opaque portion disposed therebetween, a phase difference of substantially 180 degrees in exposure light being caused between two first transmitting areas which are adjacent to each other along said first direction or said second direction among said plural first transmitting areas, a phase difference of substantially 90 degrees in said exposure light being caused between said second transmitting area and said four first transmitting areas surrounding said second transmitting area, said method comprising the steps of:
  forming a resist layer on a film used for forming a part of said electronic device;
  irradiating said resist layer with said exposure light through said phase-shifting mask;
  developing said resist layer; and
  patterning said film partially covered with said resist layer.

2. The method of manufacturing an electronic device of claim 1,
  wherein said electronic device is a semiconductor integrated circuit device, and
  said first transmitting areas and said second transmitting area of said phase-shifting mask define openings formed in said film.

3. The method of manufacturing an electronic device of claim 2,
  wherein said semiconductor integrated circuit device is a dynamic random memory,
  each of said first transmitting areas defines a storage node contact hole for connecting a memory cell and a storage part, and
  said second transmitting area defines a bit line contact hole for connecting said memory cell and a bit line.

4. The method of manufacturing an electronic device of claim 1, 2 or 3,
  wherein off-axis illumination is adopted in said step of irradiating said resist layer with said exposure light through said phase-shifting mask.

5. A method of manufacturing an electronic device using a phase-shifting mask including a transparent photomask plate, an opaque portion formed of an opaque film on said transparent photomask plate and transmitting portions formed of openings in said opaque film, said transmitting portions of said phase-shifting mask including:
  at least four first transmitting areas arranged with said opaque portion disposed therebetween, said first transmitting areas arranged along a first direction and a second direction different from said first direction; and
  at least one second transmitting area provided in a central portion of an area surrounded with said four first transmitting areas, said second transmitting area and each of said four first transmitting areas being arranged with said opaque portion disposed therebetween, a phase difference of substantially 180 degrees in exposure light being caused between two first transmitting areas which are adjacent to each other along said first direction or said second direction among said adjacent four first transmitting areas, and a phase difference of substantially 90 degrees in said exposure light being caused between said second transmitting area and said four first transmitting areas surrounding said second transmitting areas, whereby patterns corresponding to said first transmitting areas and said second transmitting area are separately formed, said method comprising an exposure step using said phase-shifting mask.

* * * * *